United States Patent
Moshtagh et al.

(10) Patent No.: US 8,668,775 B2
(45) Date of Patent: Mar. 11, 2014

(54) MACHINE CVD SHOWER HEAD (75) Inventors: Vahid S. Moshtagh, San Jose, CA (US); Jeffrey C. Ramer, Sunnyvale, CA (US)

(73) Assignee: Toshiba Techno Center Inc., Tokyo (JP)

( * ) Notice: Subject to any disclaimer, the term of this patent is extended or adjusted under 35 U.S.C. 154(b) by 772 days.

(21) Appl. No.: 12/058,380

(22) Filed: Mar. 28, 2008

(65) Prior Publication Data
US 2009/0107403 A1   Apr. 30, 2009

(51) Int. Cl.
| C23C 16/455 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl.
USPC .  118/715; 118/724; 156/345.33; 156/345.34; 156/345.37

(58) Field of Classification Search
USPC ................. 118/715, 724; 156/345.33–345.34, 156/345.37
See application file for complete search history.

(56) References Cited

U.S. PATENT DOCUMENTS

| 3,215,508 A * | 11/1965 | Piester .......................... 422/143 |
| 3,757,733 A | 9/1973 | Reinberg |
| 4,798,166 A | 1/1989 | Hirooka et al. |
| 4,812,331 A | 3/1989 | Hirooka et al. |
| 4,961,399 A | 10/1990 | Frijlink |
| 4,980,204 A | 12/1990 | Fujii et al. |
| 5,027,746 A | 7/1991 | Frijlink |
| 5,281,295 A | 1/1994 | Maeda et al. |
| 5,334,277 A | 8/1994 | Nakamura |
| 5,422,139 A * | 6/1995 | Fischer ...................... 427/248.1 |
| 5,453,124 A | 9/1995 | Moslehi et al. |
| 5,458,724 A | 10/1995 | Syverson et al. |
| 5,496,408 A | 3/1996 | Motoda |
| 5,595,606 A | 1/1997 | Fujikawa et al. |
| 5,596,606 A | 1/1997 | Montreuil |
| 5,653,808 A | 8/1997 | MacLeish et al. |
| 5,788,777 A | 8/1998 | Burk, Jr. |
| 5,871,586 A * | 2/1999 | Crawley et al. ............... 118/715 |
| 5,935,337 A * | 8/1999 | Takeuchi et al. .............. 118/724 |

(Continued)

FOREIGN PATENT DOCUMENTS

| JP | 62211914 | 9/1987 |
| JP | 03-263818 | 11/1991 |

(Continued)

OTHER PUBLICATIONS

Aixtron of Germany, "Planetary Reactor" Source Unknow, Date of publication predates date of application filing.

(Continued)

Primary Examiner — Rudy Zervigon
(74) Attorney, Agent, or Firm — Hogan Lovells US LLP (57) ABSTRACT

A shower head for a chemical vapor deposition chamber can have a housing, a plurality of bosses formed upon the housing, and an inside cover. The bosses can have bores formed therethrough. The inside cover can be attached to the bosses and can have apertures formed therein such that the apertures are generally contiguous with the bores. The housing, the bosses, and the inside cover cooperate to communicate water through the shower head. The water can cool the shower head to a temperature that is substantially lower than the temperature of other parts of the chemical vapor deposition chamber, e.g., the susceptor thereof.

12 Claims, 7 Drawing Sheets

(56) References Cited

U.S. PATENT DOCUMENTS

| | | | |
|---|---|---|---|
| 5,976,260 | A | 11/1999 | Kinoshita |
| 5,976,261 | A | 11/1999 | Moslehi |
| 6,080,241 | A | 6/2000 | Li |
| 6,086,677 | A * | 7/2000 | Umotoy et al. ............... 118/715 |
| 6,090,211 | A | 7/2000 | Kamei |
| 6,110,556 | A | 8/2000 | Bang et al. |
| 6,113,705 | A | 9/2000 | Ohashi et al. |
| 6,113,984 | A | 9/2000 | MacLeish et al. |
| 6,143,077 | A | 11/2000 | Ikeda et al. |
| 6,143,128 | A * | 11/2000 | Ameen et al. ............ 156/345.24 |
| 6,148,761 | A * | 11/2000 | Majewski et al. ............. 118/715 |
| 6,165,311 | A | 12/2000 | Collins et al. |
| 6,197,121 | B1 | 3/2001 | Gurary et al. |
| 6,203,620 | B1 * | 3/2001 | Moslehi .................... 156/345.35 |
| 6,245,192 | B1 * | 6/2001 | Dhindsa et al. ........... 156/345.34 |
| 6,302,964 | B1 * | 10/2001 | Umotoy et al. ............... 118/715 |
| 6,348,099 | B1 | 2/2002 | Xia |
| 6,387,182 | B1 * | 5/2002 | Horie et al. .................... 118/244 |
| 6,465,043 | B1 | 10/2002 | Gupta |
| 6,591,850 | B2 | 7/2003 | Rocha-Alvarez |
| 6,630,053 | B2 | 10/2003 | Yamagishi |
| 6,764,546 | B2 | 7/2004 | Raaijmakers |
| 6,812,157 | B1 | 11/2004 | Gadgil |
| 6,843,882 | B2 | 1/2005 | Janakiraman et al. |
| 6,849,241 | B2 * | 2/2005 | Dauelsberg et al. ....... 423/328.2 |
| 6,980,204 | B1 | 12/2005 | Hawkins |
| 7,479,303 | B2 * | 1/2009 | Byun .......................... 427/248.1 |
| 7,641,939 | B2 * | 1/2010 | Liu ............................ 427/255.28 |
| 7,674,352 | B2 * | 3/2010 | Bour et al. ............... 156/345.34 |
| 8,308,865 | B2 * | 11/2012 | Kim et al. ...................... 118/715 |
| 2001/0007244 | A1 | 7/2001 | Matsuse |
| 2002/0017243 | A1 * | 2/2002 | Pyo ................................ 118/715 |
| 2002/0054745 | A1 | 5/2002 | Van de Walle et al. |
| 2003/0005886 | A1 | 1/2003 | Park et al. |
| 2003/0005958 | A1 | 1/2003 | Rocha-Alvarez et al. |
| 2003/0094903 | A1 | 5/2003 | Tao et al. |
| 2003/0133854 | A1 | 7/2003 | Tabata et al. |
| 2003/0213436 | A1 | 11/2003 | Kwon |
| 2003/0221624 | A1 | 12/2003 | Jurgensen |
| 2004/0082171 | A1 | 4/2004 | Shin et al. |
| 2004/0089235 | A1 | 5/2004 | Yamada |
| 2004/0099213 | A1 | 5/2004 | Adomaitis et al. |
| 2004/0129215 | A1 | 7/2004 | Kaeppeler et al. |
| 2004/0216668 | A1 | 11/2004 | Lindfors et al. |
| 2005/0003600 | A1 | 1/2005 | Kasai et al. |
| 2005/0011436 | A1 | 1/2005 | Liu |
| 2005/0092248 | A1 * | 5/2005 | Lee et al. ....................... 118/715 |
| 2006/0021574 | A1 * | 2/2006 | Armour et al. ................ 118/715 |
| 2006/0121193 | A1 | 6/2006 | Strauch et al. |
| 2007/0148349 | A1 * | 6/2007 | Fukada ........................ 427/248.1 |
| 2007/0163440 | A1 * | 7/2007 | Kim et al. ........................... 96/52 |
| 2007/0272154 | A1 * | 11/2007 | Amikura et al. .............. 118/719 |
| 2008/0057197 | A1 | 3/2008 | Liu |
| 2008/0124463 | A1 * | 5/2008 | Bour et al. ................ 427/255.28 |
| 2008/0236495 | A1 * | 10/2008 | Tompa ........................... 118/724 |
| 2009/0095221 | A1 * | 4/2009 | Tam et al. ....................... 118/715 |
| 2009/0095222 | A1 * | 4/2009 | Tam et al. ................... 118/723 R |
| 2009/0098276 | A1 * | 4/2009 | Burrows et al. ..................... 427/8 |
| 2009/0107403 | A1 * | 4/2009 | Moshtagh et al. ............. 118/728 |
| 2009/0162260 | A1 * | 6/2009 | Bera et al. ................. 422/186.04 |
| 2009/0162261 | A1 * | 6/2009 | Baera et al. ............... 422/186.04 |
| 2009/0162262 | A1 * | 6/2009 | Bera et al. ................. 422/186.04 |
| 2009/0169744 | A1 * | 7/2009 | Byun et al. ................ 427/255.28 |
| 2009/0178615 | A1 * | 7/2009 | Kim et al. ...................... 118/715 |
| 2009/0211707 | A1 * | 8/2009 | Chao et al. ............... 156/345.34 |
| 2009/0218314 | A1 * | 9/2009 | Davis et al. ...................... 216/60 |
| 2009/0241833 | A1 * | 10/2009 | Moshtagh et al. ............. 118/715 |
| 2009/0266911 | A1 * | 10/2009 | Kim et al. .................. 239/265.11 |
| 2010/0003405 | A1 * | 1/2010 | Kappeler .................. 427/255.28 |
| 2010/0261340 | A1 * | 10/2010 | Nijhawan et al. ............. 438/478 |
| 2010/0273291 | A1 * | 10/2010 | Kryliouk et al. ................ 438/99 |
| 2010/0300359 | A1 * | 12/2010 | Armour et al. ................ 118/724 |
| 2011/0023782 | A1 * | 2/2011 | Han ............................... 118/724 |
| 2011/0052833 | A1 * | 3/2011 | Hanawa et al. ............... 427/534 |

FOREIGN PATENT DOCUMENTS

| | | |
|---|---|---|
| JP | 1992-209794 | 7/1992 |
| JP | 1995-111244 | 1/1995 |
| JP | 07-111244 | 4/1995 |
| JP | 1998-12554 | 1/1998 |
| JP | 1998-158843 | 6/1998 |
| JP | 2002-110567 | 4/2002 |
| JP | 2003-309075 | 10/2003 |
| WO | WO 92/05577 | 4/1992 |
| WO | WO 99/36587 | 7/1999 |
| WO | 0218672 A1 | 3/2002 |
| WO | WO 2005/010227 | 2/2005 |

OTHER PUBLICATIONS

H. Jürgensen et al, "MOCVD Equipment for Recent Developments Towards the Blue and Green Solid State Laser", MRS Internet Journal of Nitride Semiconductor Research, vol. 1, Article 26, published 1996.

J. Dai "Atmospheric pressure MOCVD Growth of high-quality ZnO films on A1 O templates", Journal of Crystal Growth 283 (2005), pp. 93-99.

Theodoropoulos et al. "Design of gas inlets for the growth of gallium nitride by metalorganic vapor phase epitaxy", Journal of Crystal Growth 217 (200), pp. 65-81.

Thomas Swan, "CVD Reactor", Source Unknown, Date of publication predates date of application filing.

H. Jurgensen, et al., "MOCVD Equipment for Recent Developments Towards the Blue and Green Solid State Laser", MRS Internet Journal of Nitride Semiconductor Research, vol. 1, Article 26, 1996.

Woelk, "Metalorganic Vapor Phase Epitaxy for Specialty Semiconductor Devices", Source Unknown Date of publication predates date of application.

U.S. Appl. No. 10/621,049, filed Jul. 15, 2003, Liu, Heng.
U.S. Appl. No. 12/259,787, filed Oct. 28, 2008, Moshtag, et al.
U.S. Appl. No. 11/064,984, filed Feb. 23, 2005, Heng Liu.
U.S. Appl. No. 11/932,293, filed Oct. 31, 2007, Heng Liu.
U.S. Appl. No. 11/740,736, filed Apr. 26, 2007, Heng Liu.
U.S. Appl. No. 10/727,746, filed Dec. 3, 2003, Heng Liu.
U.S. Appl. No. 12/273,943, filed Nov. 19, 2008, Heng Liu.
U.S. Appl. No. 12/165,269, filed Jun. 30, 2008, Vahid S. Moshtagh et al.
U.S. Appl. No. 12/259,787, filed Oct. 28, 2008, Vahid S. Moshtagh et al.
German Patent Office, Office Action, mailed Apr. 19, 2013.

* cited by examiner

MACHINE CVD SHOWER HEAD

TECHNICAL FIELD

The present invention relates generally to chemical vapor deposition (CVD). The present invention relates more particularly to a method and system for cooling a shower head of a chemical vapor deposition chamber.

BACKGROUND

The use of chemical vapor deposition (CVD) for fabricating light emitting diodes (LEDs) is well known. Chemical vapor deposition is performed in a chamber. Wafers are placed upon a susceptor within the chamber. A vacuum is formed in the chamber. The susceptor rotates the wafers as reactant gases are applied to the wafers so as to form desired layers of material thereon.

The reactant gases can be applied to the wafers via a shower head that is disposed above the susceptor. The susceptor can be at a comparatively high temperature. It is generally desirable to maintain the shower head at a lower temperature than the susceptor.

In view of the foregoing, it is desirable to provide a method and system for cooling the shower head of a chemical vapor deposition chamber so as to maintain the shower head at a lower temperature than the susceptor of the chemical vapor deposition chamber.

BRIEF SUMMARY

Systems and methods are disclosed herein for cooling a shower head of a chemical vapor deposition (CVD) chamber. According to one aspect, a shower head for a chemical vapor deposition chamber can comprise a housing and an inside cover for the housing. A plurality of bosses can be formed upon the housing and the inside cover can attach to the bosses. The bosses can have bores formed therethrough and the inside cover can have apertures formed therein such that the apertures are contiguous with the bores. The housing, the bosses, and the inside cover can cooperate to communicate water for cooling of the shower head.

According to an aspect, a method of forming a shower head for a chemical vapor deposition chamber can comprise forming a plurality of bosses on a housing and attaching an inside cover to the bosses so as to form a watertight seal with respect to the bosses. The housing, the bosses, and the inside cover can cooperate to communicate water for cooling of the shower head.

According to an aspect, a method of cooling a shower head of a chemical vapor deposition chamber can comprise communicating water around a plurality of bosses formed in a housing of the shower head. The bosses can have bores extending therethrough to facilitate injection of reactant gases into the chemical deposition chamber.

According to an aspect, a chemical vapor deposition reaction can comprise a susceptor and a shower head disposed proximate the susceptor. The shower head can comprise a housing, a plurality of bosses formed upon the housing, and an inside cover. The bosses can have bores formed therethrough. The inside cover can be attached to the bosses. The inside cover can have apertures formed therein such that the apertures are generally contiguous with the bores. The housing, the bosses, and the inside cover can cooperate to communicate water for cooling of the shower head.

By cooling the shower head in this manner, the shower head can be maintained at a substantially lower temperature than the susceptor, which must be maintained at a much higher temperature to facilitate the chemical vapor deposition process.

This invention will be more fully understood in conjunction with the following detailed description taken together with the following drawings.

BRIEF DESCRIPTION OF THE DRAWINGS

Aspects of the present invention and their advantages are best understood by referring to the detailed description that follows. It should be appreciated that like reference numerals are used to identify like elements illustrated in one or more of the figures.

DETAILED DESCRIPTION

Metal organic chemical vapor deposition (MOCVD) reactors are used to fabricate light emitting diodes (LEDs). Metal organic chemical vapor deposition is one type of chemical vapor deposition (CVD). LEDs can be fabricated by depositing layers of gallium nitride (GaN) on sapphire wafers. In the chamber of a MOCVD reactor, sapphire wafers are placed on a susceptor which is typically heated to approximately 1000° C. This high temperature facilitates the desired chemical vapor deposition process. The susceptor can be rotated during the deposition process to promote more uniform deposition.

Reactant gases can be applied to the wafers from a shower head. The reactant gases can be injected into the chamber via a larger number, e.g., thousands, of holes or injectors formed in the shower head. The shower head can be located very close to the hot susceptor. For example, the shower head can be located a 12 millimeter from the susceptor.

The temperature of the shower head must generally be kept substantially lower than the temperature of the susceptor during the chemical vapor deposition process, so as to inhibit damage to the shower head and to promote the deposition of the reactant chemicals on the susceptor, instead of the showerhead surface itself. For example, it is generally desirable to maintain the inside surface (that surface facing the inside of the chemical vapor deposition chamber) of shower head below 200 C.

The chamber, including the shower head, can be water cooled. It is very important that cooling water be prevented from entering the chemical vapor deposition chamber. A very small amount of water, e.g., a few parts per billion, can ruin the vapor deposition process. The entry of water into the chamber can result in the rejection of wafers, as well as costly downtime caused by the need to repair and thoroughly clean the chamber.

The chamber can have a top that is sealed by the shower head and a bottom that is mounted to exhaust port. The chamber is able to maintain desired vacuum. Excessive heat can cause the shower head to warp and thus compromise the chamber seal and allow air to enter the chamber.

According to one aspect, a shower head for a chemical vapor deposition chamber is configured to be water cooled. The shower head can comprise a housing and an inside cover. A plurality of bosses can be formed upon the housing. The bosses can have bores formed therethrough. The inside cover can be attached to the bosses. The inside cover can have apertures formed therein such that the apertures are generally contiguous with the bores of the bosses. Thus, the chamber is double wall water cooled to maintain integrity.

The housing, the bosses, and the inside cover can cooperate to communicate water for cooling of the shower head. The housing, the bosses, and the inside cover can define a plurality of channels that extend throughout a substantial portion of the shower head, particularly proximate the inside surface thereof. Water can flow though these channels so as to effect cooling of the shower head.

The bosses can be formed upon a bottom surface of the housing. Thus, the bosses can be formed upon that surface of the housing that faces inwards, toward the susceptor. The bosses can function as injectors for injecting reactant gases into the chamber.

The shower head can comprise stainless steel. For example, the housing, the bosses, and the inside cover can comprise stainless steel. Those skilled in the art will appreciate that other materials are likewise suitable. For example, the housing, the bosses, and the inside cover can comprises steel, stainless steel, aluminum, magnesium, glass, ceramic, and any desired combination of such materials.

The bosses can be formed integrally or monolithically with the housing. For example, the bosses can be machined into the housing. Alternatively, the bosses can be formed separately with respect to the housing and can be attached to the housing.

The inside cover can be attached to the housing in a manner that prevents cooling water from contacting the reactant gasses and/or entering the chemical vapor deposition chamber. For example, the inside cover can be brazed to the housing. More particularly, the inside cover can be brazed to the bosses and a periphery of the housing.

The bosses can define injectors for injecting reactant gasses into the chemical vapor deposition chamber. For example, the bores of the bosses and the apertures of the inside cover can cooperate to communicate reactant gases into the chemical vapor deposition chamber.

One or more partitions can cooperate with the housing and an outside cover define zones that separate reactant gases prior to the reactant gases entering the chemical vapor deposition chamber. Any desired number of zones can be defined. For example, the shower head can comprise a plurality of concentric, generally circular, partitions that defining a plurality of zones. The partitions can be formed integrally with the housing.

The partitions can be formed on an opposite side of the housing with respect to the side of the housing upon which the bosses are formed. For example, the bosses can be formed upon an inside (chamber facing) surface of the housing and the partitions can be formed upon an outside surface of the housing.

Thus, water cooling can be used to keep the inside surface of the shower head at a substantially lower temperature than the susceptor. Keeping the shower head at a substantially lower temperature than the susceptor mitigates air leakage into the chemical vapor deposition chamber and tends to enhance the uniformity of reactant gas injection across the shower head.

Figure 1:
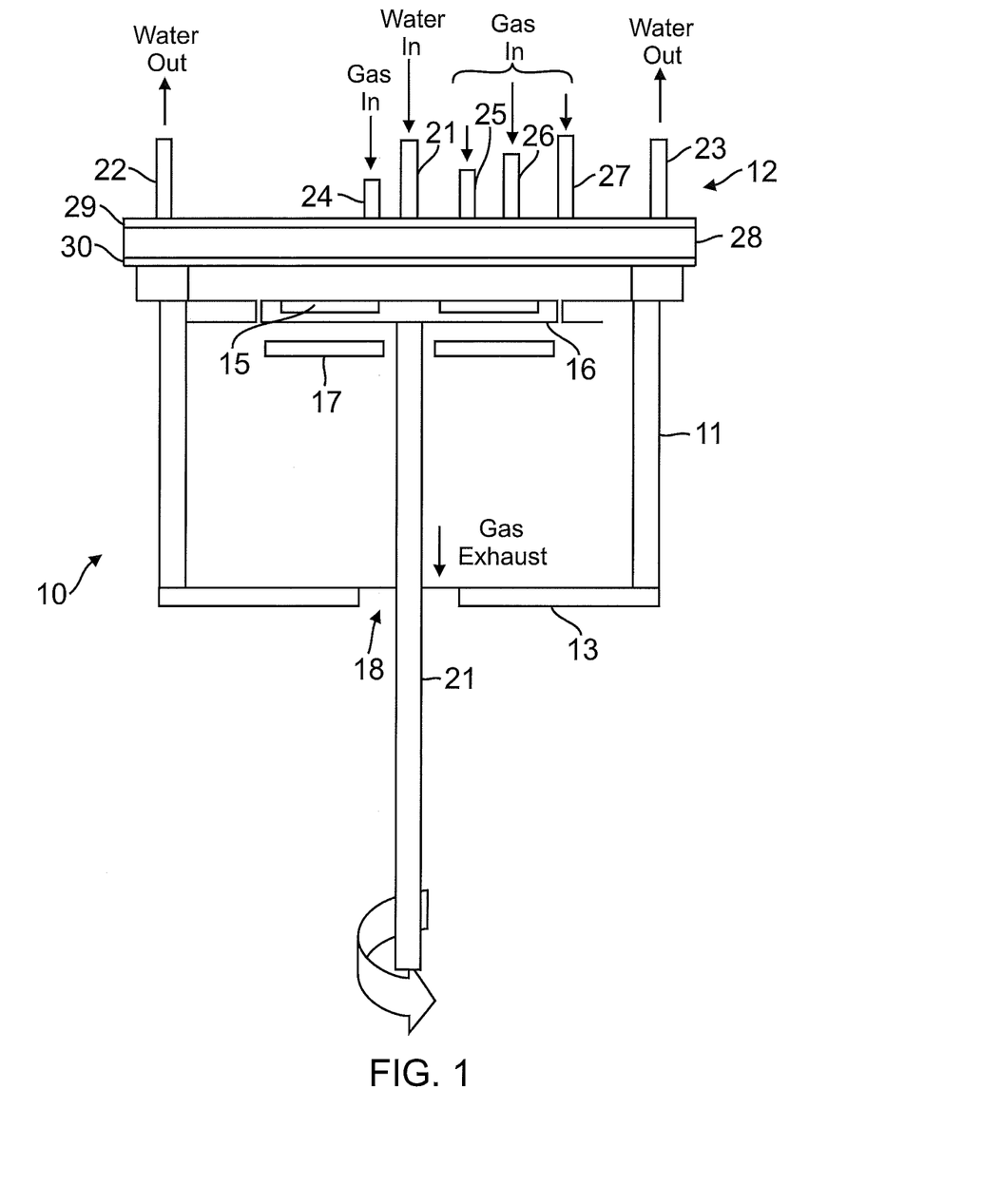
FIG. 1 is a semi-schematic, cross-sectional, side view of a chemical vapor deposition (CVD) reactor having a brazed shower head, according to an example of an embodiment.

Referring now to FIG. 1, a chemical vapor deposition chamber 10 can comprise a generally cylindrical wall 11, a base plate 13, and a lid that is defined by a shower head 12. A susceptor 16 can be rotatably disposed proximate the shower head 12. A rotatable shaft 21 can facilitate rotation of the susceptor 16.

The shower head 12 can define a lid for the chemical vapor deposition chamber 10 that provides a substantially airtight seal to the wall 11 of the chemical vapor deposition chamber. This seal must generally be maintained throughout the chemical vapor deposition process.

The susceptor 16 can support a plurality of wafers 15 thereon. The wafers 15 can be moved, e.g., rotated, beneath the shower head 12 so as to facilitate the formation of desired materials thereon according to the chemical vapor deposition process. In this manner, light emitting diodes (LEDs) can be fabricated.

Heaters 17 heat the susceptor 16 so as to facilitate the chemical vapor deposition process. The susceptor 16 can be heated to a temperature that necessitates cooling of the shower head 12. For example, the susceptor 16 can be heated to a temperature of approximately 1000° C., while the inside surface of shower head should be maintained at a temperature of less than 200° C.

Cooling water can be provided to the shower head 12 via a water inlet tube 21. The cooling water can exit the shower head 12 via water outlet tubes 22 and 23. The cooling water cools the shower head 12, particularly the lower portion thereof, so as to mitigate heat damage thereto, as discussed herein.

Reactant gasses enter the shower head 12 via gas inlet tubes 24-27. The reactant gases are maintained separate from one another within the showerhead 12 by partitions 31-33 (FIGS. 3, 4, and 7-9), as discussed below. The reactant gases are injected into the chemical vapor deposition chamber 10 by injectors that can be defined by bosses 41 (FIGS. 4-6 and 9). Depleted reactant gases exit the chemical vapor deposition chamber 10 via gas exhaust 18.

According to an aspect, the shower head 12 can comprise a housing 28 to which an outside cover 29 and an inside cover 30 are attached. The outside cover 29 and the inside cover 30 can be attached to the housing by brazing. The inside cover 30 cooperates with the housing 28 to form channels through which cooling water from the water inlet tube 21 flows prior to exiting the shower head 12 via the water outlet tubes 22 and 23.

Figure 2:
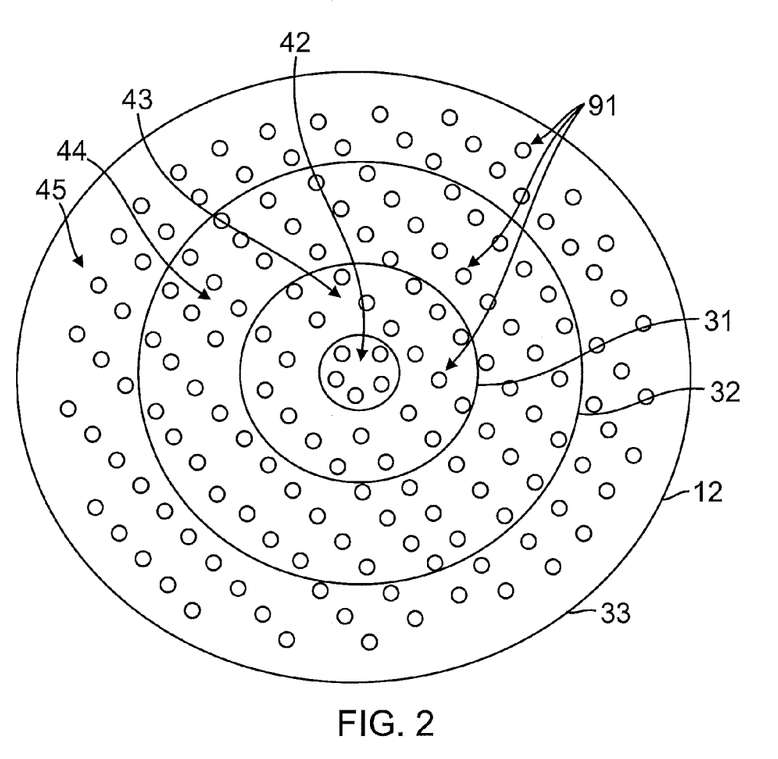
FIG. 2 is a semi-schematic, bottom view of the shower head of FIG. 1, showing injectors thereof grouped into zones, according to an example of an embodiment.

Referring now to FIG. 2, partitions 31-33 or the like can be used to define two or more zones 42-45. Each zone 42-45 can facilitate the injection of different reactant gasses and/or different concentrations of reactant gasses into the chemical vapor deposition chamber 10 via bores 51 of the bosses 41. The use of such zones 42-45 can enhance control of the injection of reactant gasses into the chemical vapor deposition chamber 10.

Figure 3:
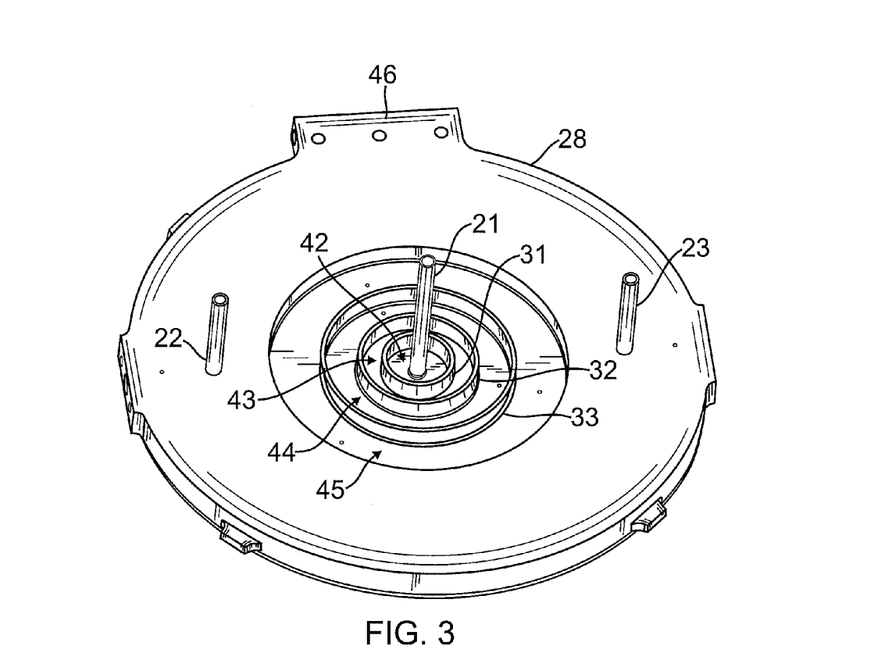
FIG. 3 is a semi-schematic, perspective, top view of the housing of the shower head of FIG. 1, showing partitions formed therein for defining zones, according to an example of an embodiment.

Referring now to FIG. 3, the partitions 31-33 can be formed in or upon the housing 28 so as to define the zones 42-45. Any desired number of zones can be formed in this manner. For example, one, two, three, four, or more zones can be formed in this manner. The partitions 31-33 can be formed by machining the outside surface of the housing 28 such that the partitions 31-33 are formed integrally with the housing 28.

A flange 46 can facilitate attachment of the shower head 12 to a hinge such that the shower head 12 can function as a lid of the chemical vapor deposition chamber 10. The hinge can also attach to the wall 11 of the chemical vapor deposition chamber. The lid can thus be opened and shut using the hinge.

Figure 4:
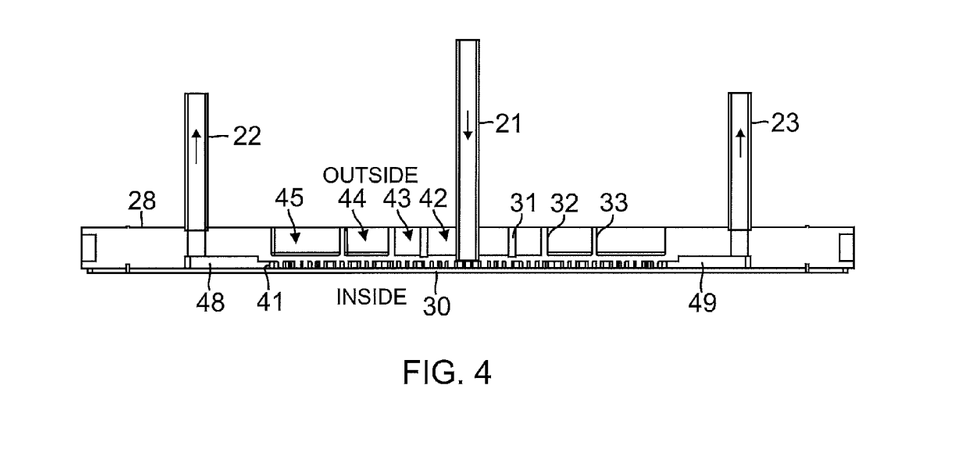
FIG. 4 is a semi-schematic, cross-sectional, side view of the housing of the shower head of FIG. 1, showing bosses and partitions formed therein, according to an example of an embodiment.

Referring now to FIG. 4, a plurality of bosses 41 (better shown in FIGS. 6 and 9) can be formed on the inside surface of the housing 28. The bosses 41 can be formed by machining inside surface of the housing 28 such that the bosses 41 are formed integrally with the housing 28.

The inside cover 30 can attached to the inside surface of the housing 28. In this manner, cooling water from the water inlet tube 21 is caused to flow between the bosses 41 to the water outlet channels 48 and 49. The cooling water flows through channels 93 (FIG. 9) defined by the housing 28, the bosses 41, and the inside cover 30. In this manner, the cooling water has intimate contact with the bosses 41 and the inside cover 30. Cooling water from the water outlet channels 48 and 49 flows into the water outlet tubes 22 and 23.

Figures 5, 6:
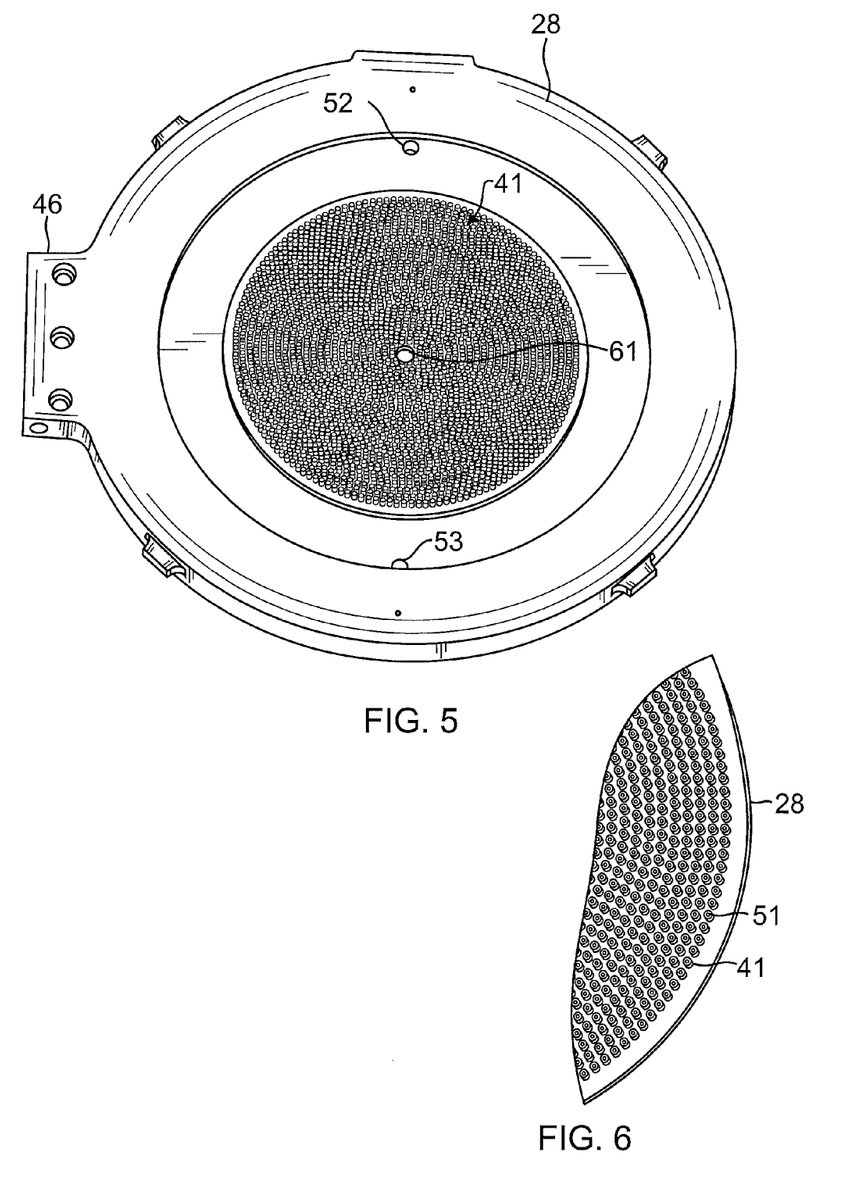
FIG. 5 is a semi-schematic, perspective, bottom view of the housing of the shower head of FIG. 1, showing the bosses thereof, according to an example of an embodiment.
FIG. 6 is a semi-schematic, enlarged, fragmentary, bottom view of the housing of the shower head of FIG. 1, showing the bores formed in the bosses, according to an example of an embodiment.

Referring now to FIG. 5, the bosses 41 can be formed in a generally circular area proximate the center of the inside surface of the housing 28. A large number of such bosses 41 can be formed so as to more uniformly distribute the reactant gasses into the chemical vapor deposition chamber 10. For example, several thousand bosses 41 can be formed on the housing 28. Any desired number of bosses 41 can be so formed.

Opening 61 facilitates the flow of cooling water from the water inlet tube 21 (FIGS. 1, 3, 4, 8, and 9) into the channels 93 defined by the housing 28, the bosses 41, and the inside cover 30. Similarly, openings 52 and 53 facilitate the flow of cooling water from these channels into the water outlet tubes 22 and 23, respectfully.

Referring now to FIG. 6, bores 51 are formed in the bosses 41. The bores 51 extend through both the housing 28 and the bosses 41. The bosses 41 extend from the inside surface of the housing 28. The bores 51 facilitate the flow of reactant gases from the zones 42-45 defined by partitions 31-33 into the chemical vapor deposition chamber 10.

Figure 7:
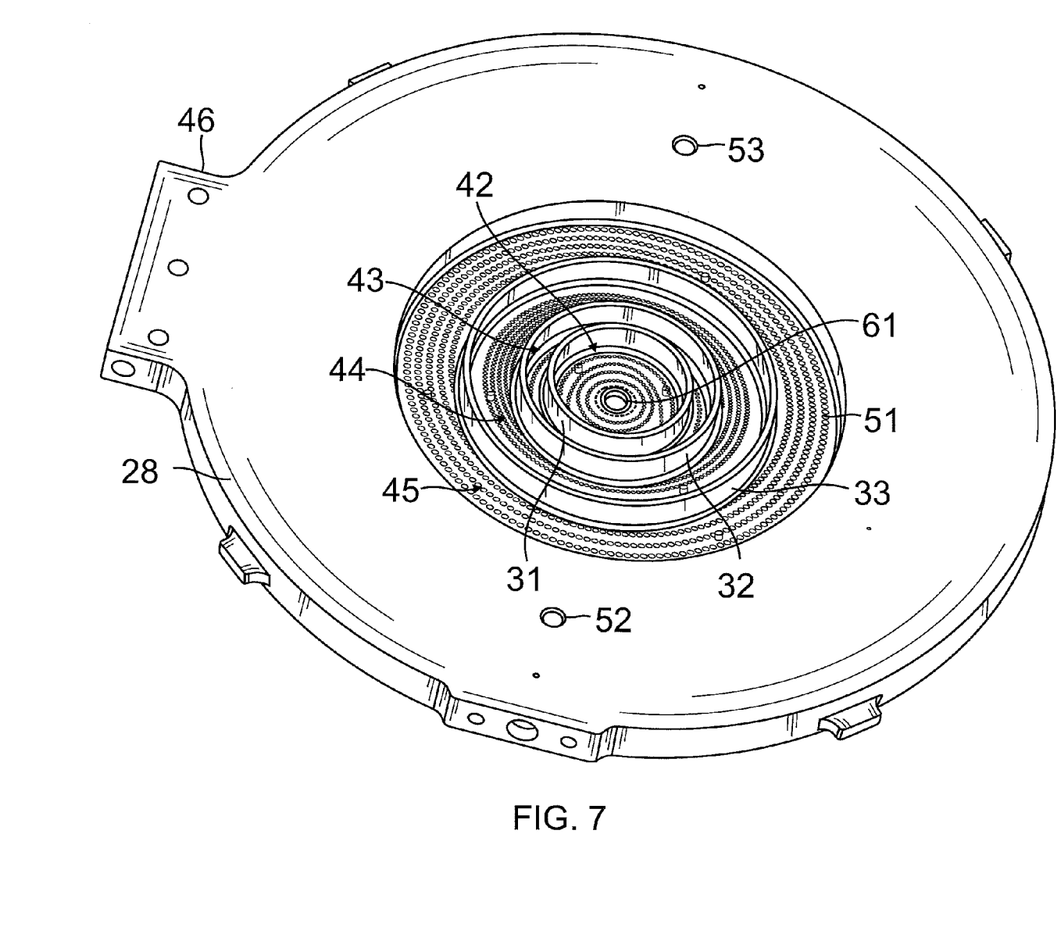
FIG. 7 is a semi-schematic, perspective, top view of the housing of the shower head of FIG. 1, showing partitions formed therein and showing bores that extend into the bosses that are formed upon the lower surface of the shower head, according to an example of an embodiment.

Referring now to FIG. 7, the bores 51 can be seen in the outside surface of the housing 28. Each bore 51 facilitates the flow of reactant gases from the zone 42-45 within which the bore 51 is located into the chemical vapor deposition chamber 10.

Figure 8:
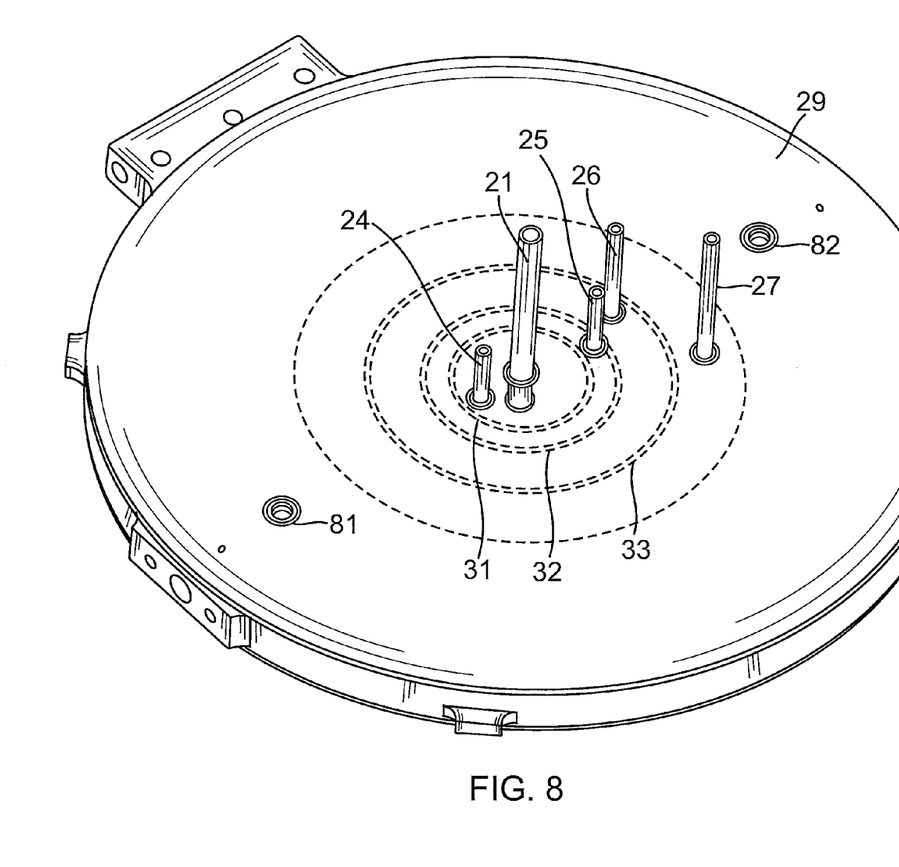
FIG. 8 is a semi-schematic, perspective, top view of the shower head of FIG. 1, showing an outside cover attached to the housing and showing the water and gas inlets attached to the outside cover, according to an example of an embodiment.

Referring now to FIG. 8, the outside surface of the shower head 12 is shown with the outside cover 29 installed and with the water inlet tube 21 and the gas inlets 24-27 attached to the outside cover 29. The partitions 31-33, which are beneath the outside cover 29, are shown in dashed lines. Openings 81 and 82 facilitate the flow of cooling water from the shower head 12 and into the water outlet tubes 22 and 23 (FIGS. 1, 3, and 4).

Figure 9:
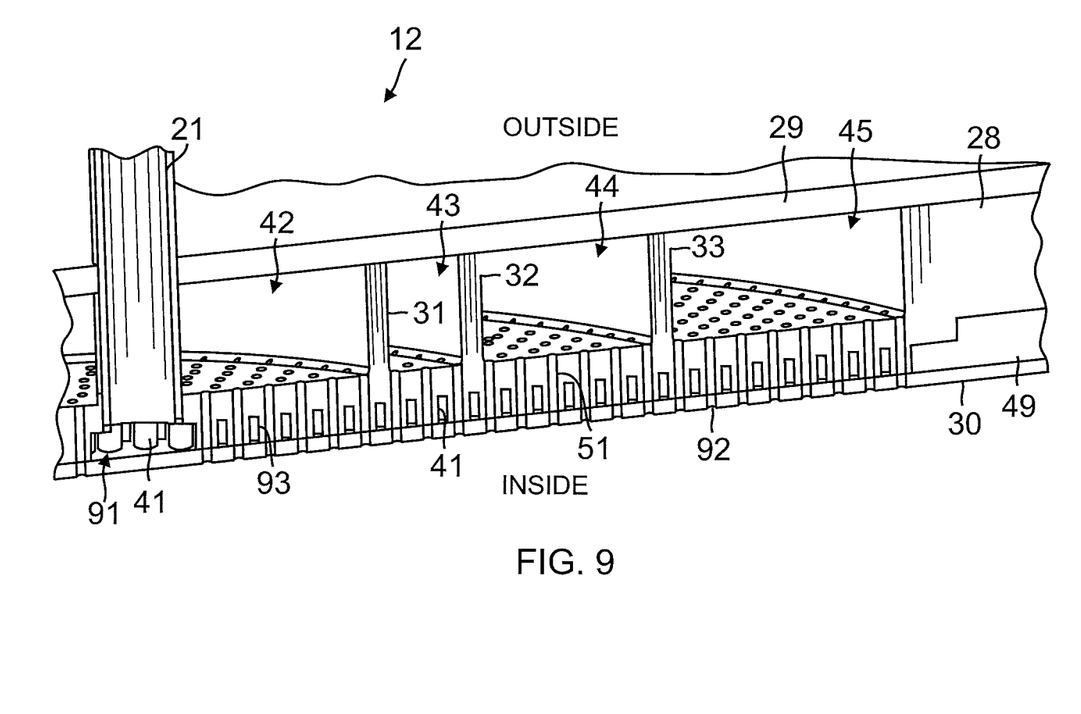
FIG. 9 is a semi-schematic, cross-sectional, fragmentary, perspective, view of the shower head of FIG. 1, showing the inside and outside covers attached to the housing, according to an example of an embodiment.

Referring now to FIG. 9, the shower head 12 is shown in cross-section. The zones 42-45 defined by partitions 31-33 can be seen. Each zone 42-45 defines a void, ring, or manifold though which a reactant gas can flow into the bores 51 of the bosses 41 and then though apertures 92 of the inside cover 30. The apertures 92 are generally contiguous with the bores 41. As shown, the partitions 31-33 define four such zones, thus facilitating the use of four different reactant gases. Each reactant gas can contain different reactants and/or different concentrations of reactants.

For example, the innermost zone 42, defined as that zone inside of partition 31, can be used to provide ammonia ($NH_3$) to the chemical vapor deposition chamber 10. The other three zones, defined as zone 45 between partition 31 and partition 32, zone 44 between partition 32 and partition 33, and zone 45 outside of partition 33, can be used to provide varying concentrations of Group III metalorganic gases to the chemical vapor deposition chamber.

Reactant gases enter the zones 42-45 via gas inlets 24-27 (FIGS. 1 and 8). For example, one reactant gas can enter the zone 42 via gas inlet 24, another reactant gas can enter the zone 43 via gas inlet 25, and so on. Reactant gas from each zone 42-45 can flow through the bores 51 of the bosses 41 and through the apertures 92 of the inside cover 30 so as to be injected into the chemical vapor deposition chamber 10.

A water inlet channel 91 is defined proximate (generally beneath) the water inlet tube 21. Cooling water from the water inlet tube 21 flows into the water inlet channel 91 and then into the channels 93 formed between the bosses 41.

During the chemical vapor deposition process, the heater 17 (FIG. 1) heats the susceptor 16. The hot susceptor 17 heats the shower head 12, particularly the inside surface of the shower head 12. Cooling water enters the shower head 12 via the water inlet tube 21. The cooling water flows from the water inlet tube 21 into the water inlet channel 91 (FIG. 9) and then flows through the channels 93 defined by the housing 28, the inside cover 30, and the bosses 41. As the cooling water flows through the channels defined by the housing 28, the inside cover 30, and the bosses 41, the cooling water removes heat, particularly from the inside cover 30 and the bosses 41. After the cooling water flows through the channels defined by the housing 28, the inside cover 30, and the bosses 41, the cooling water enters the water outlet channels 48 and 49, from which the cooling water flows into the water outlet tubes 22 and 23.

Generally, the water flows outwardly, from proximate the center of the shower head 12 to proximate the periphery of the shower head 12. In flowing through the channels 93, the cooling water removes heat from the shower head 12, particularly the bosses 41 and the lower surface thereof defined by the inside cover 30. This heat is removed from the shower head 12 when the heated cooling water exits the shower head 12 via the water outlets 22 and 23.

In this manner, the bosses 41, which function as injectors and thus inject the reactant gasses into the chemical vapor deposition chamber 10, are kept at a lower and more uniform temperature. As those skilled in the art will appreciate, keeping the injectors of a chemical vapor deposition chamber 10 at a lower and more uniform temperature tends to enhance the uniformity and efficiency of the distribution of the reactant gases and consequently tends to desirably enhance the efficiency of material formation upon the wafers 15.

The shower head 12 can be made by machining the partitions 31-33 and the bosses 41 into the housing 28. Thus, the partitions 31-33 and the bosses 41 can be formed integrally with the housing 28 and can be formed of the same material as the housing 28. Alternatively, the partitions 31-33 and/or the bosses 41 can be made separately from the housing 28 and/or can be made from a different material with respect to the housing 28. For example, the partitions 31-33 and/or the bosses 41 can be made separately from the housing 28 and then attached to the housing 28.

The inside cover 30 can be brazed to the bosses 41 and a periphery of the housing 28 so as to form a watertight seal therewith. In this manner, the leakage of cooling water into the chemical vapor deposition chamber 10 can be mitigated.

The inside cover 30 can be brazed to the bosses 41 and the periphery of the housing 28 by placing a sheet comprised of nickel, for example, between the inside cover 30 and the housing 28. The housing 28, the inside cover 30, and the sheet of nickel can then be heated, such as in an oven, so as to effect brazing.

The bores 51 in the bosses 41 and the apertures 92 in the inside cover 30 can be drilled after the inside cover 30 is brazed to the housing 28.

The outside cover 29 can be attached to the housing 28 by brazing in a fashion similar to the attachment of the inside cover 30 to the housing 28. The outside cover 29 can be attached to the housing 28 by brazing at the same time that the inside cover 30 is brazed to the housing 28. Alternatively, the outside cover 29 can be attached to the housing by fasteners or by any other desired method.

Cooling the shower head 12 inhibits heat damage thereto. As those skilled in the art will appreciate, such heat damage can compromise the structural integrity of the chemical vapor deposition chamber and can cause air leakage thereinto. Cooling the shower head 12 also tends to make the temperature thereacross more uniform and thus enhances the uniformity of the injection of reactant gasses. Due to the low pyrolysis temperatures of the metalorganic chemicals used in the process (as low as 300 C for the GaN MOCVD process), efficient cooling of the shower head is also required in order to keep the CVD reaction from occurring on the showerhead surface.

Embodiments described above illustrate, but do not limit, the invention. It should also be understood that numerous modifications and variations are possible in accordance with the principles of the present invention. Accordingly, the scope of the invention is defined only by the following claims.

The invention claimed is:

1. A shower head for a chemical vapor deposition chamber, the shower head comprising:
    a housing;
    an outside cover attached to the housing;
    a water inlet disposed on the outside cover;
    a plurality of gas inlets disposed on the outside cover;
    at least one partition formed integrally with the housing, a plurality of zones defined by the partition and the outside cover and disposed along the outside cover, the zones separating reactant gases prior to the reactant gases entering the chemical vapor deposition chamber;
    a plurality of bosses machined into the housing to be integrated with the housing, the bosses having bores formed therethrough, the reactant gases flowing into the bores from the zones; and
    an inside cover attached at a bottom of the housing, the plurality of bosses formed upon the inside cover, the inside cover having apertures formed therein such that the apertures are generally contiguous with the bores so that the reactant gases flow from the bores into the chemical vapor deposition chamber through the apertures,
    wherein the housing, the bosses, and the inside cover form a channel where water flows and contacts the bosses for cooling of the shower head.

2. The shower head as recited in claim 1, wherein the housing is configured to facilitate the formation of a vacuum with the chamber.

3. The shower head as recited in claim 1, wherein the housing is formed of stainless steel.

4. The shower head as recited in claim 1, wherein the bosses are formed of stainless steel.

5. The shower head as recited in claim 1, wherein the inside cover is formed of stainless steel.

6. The shower head as recited in claim 1, wherein the inside cover is brazed to the housing.

7. The shower head as recited in claim 1, wherein the inside cover is brazed to the bosses and a periphery of the housing.

8. The shower head as recited in claim 1, wherein the bores of the bosses and the apertures of the inside cover cooperate to communicate reactant gases into the chemical vapor deposition chamber.

9. The shower head as recited in claim 1, wherein the partition comprises a plurality of concentric, generally circular, partitions.

10. The shower head as recited in claim 1, further comprising:
    a water outlet disposed in a periphery of the shower head, wherein the water inlet is disposed on a center of the outside cover, and
    the water inlet, the channel and the water outlet are fluidly connected to flow water from the center of the outside cover to the periphery of the shower head removing heat from the plurality of bosses and the inside cover.

11. The shower head as recited in claim 1, wherein the reactant gasses are introduced into the shower head via the gas inlets, maintained separate from one another within the housing by the zones, and injected into the chemical vapor deposition chamber through the bores of the bosses and the apertures of the inside cover.

12. The shower head as recited in claim 1, further comprising a water outlet disclosed in a periphery of the shower head, wherein the water is introduced from the water inlet and flows between the bosses to the water outlet.

* * * * *